United States Patent [19]
Noh

[11] Patent Number: 5,946,115
[45] Date of Patent: Aug. 31, 1999

[54] HOLOGRAM MEMORY DEVICE

[75] Inventor: Sung Woo Noh, Kyungki-do, Rep. of Korea

[73] Assignee: LG Electronics Inc., Seoul, Rep. of Korea

[21] Appl. No.: 08/975,168

[22] Filed: Nov. 20, 1997

[30] Foreign Application Priority Data

Nov. 23, 1996 [KR] Rep. of Korea ....................... 96-56876

[51] Int. Cl.$^6$ ....................................... G03H 1/26
[52] U.S. Cl. .................. 359/22; 359/10; 359/25; 359/28; 365/125; 365/216
[58] Field of Search .................. 359/10, 15, 20, 359/22, 24, 25, 28, 30; 365/125, 216

[56] References Cited

U.S. PATENT DOCUMENTS 3,761,155  9/1973  Lo et al. ..................................... 359/25
4,824,192  4/1989  Roberts ....................................... 359/22

FOREIGN PATENT DOCUMENTS 1412526  11/1975  United Kingdom ..................... 359/22

Primary Examiner—Cassandra Spyrou
Assistant Examiner—Darren E. Schuberg
Attorney, Agent, or Firm—Fleshner & Kim

[57] ABSTRACT

Fast speed hologram memory device, including a first holographic optical element array for directing a reference beam to a desired hologram memory cell directly and a second holographic optical element array for directing an objective beam to a desired hologram memory cell directly, both having a plurality of holographic optical elements one to one matched to a plurality of the hologram memory cells.

37 Claims, 7 Drawing Sheets

F I G.7a
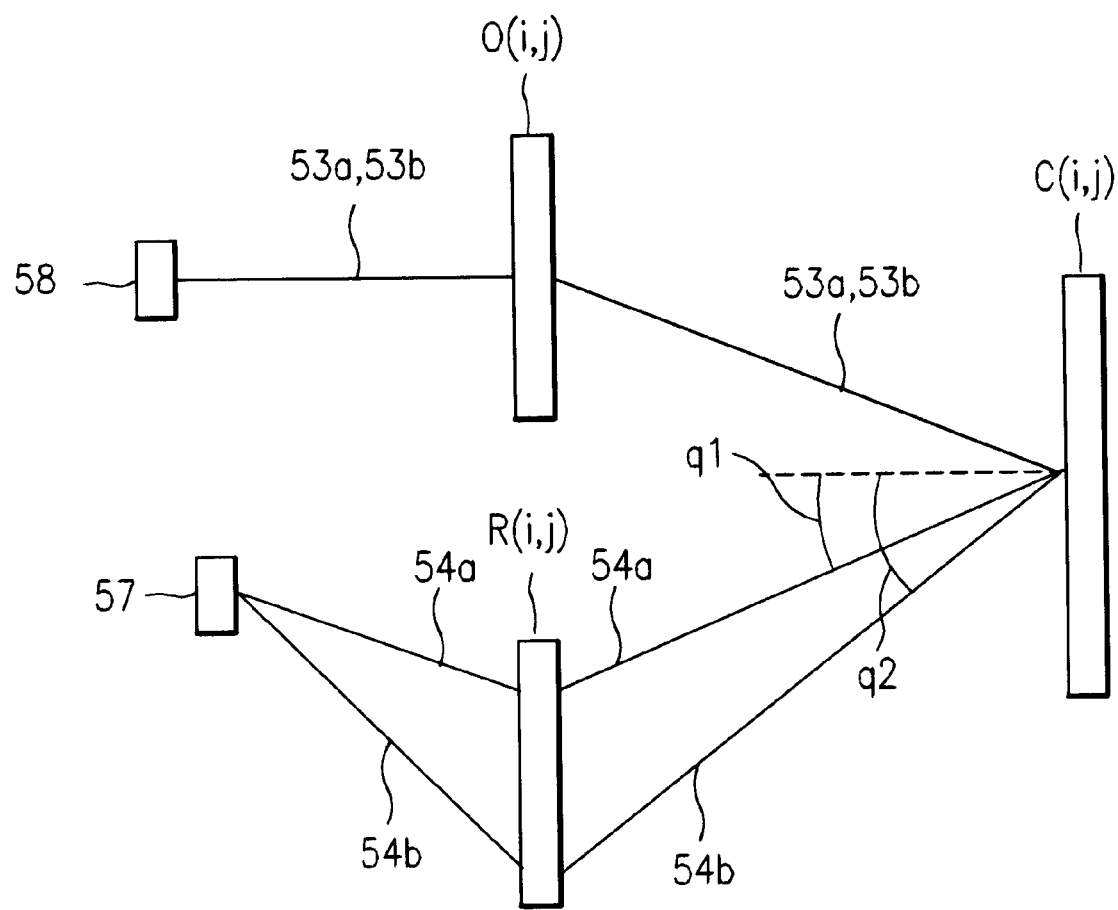

HOLOGRAM MEMORY DEVICE

BACKGROUND OF THE INVENTION

1. Field of the Invention

The present invention relates to a hologram memory device.

2. Discussion of the Related Art

Though discs, tapes, and the like are used widely as information storing medium currently, as amount of the information becomes greater, a requirement for a new storing medium becomes greater due to the slow access time and limited capacity of current storing medium. In order to meet this requirement, different information storing medium are under development, particularly the hologram memory device attracts attention because it is favorable in view of large capacity and fast access time.

The operation principle of a conventional hologram memory device will be explained referring to FIGS. 1a and 1b.

Upon incident of an objective light 1 and a first reference light 2 to the hologram memory cell 3 in recording, a first interference pattern 4 caused by the interference of the two lights 1 and 2 is recorded in the hologram memory cell 3. When only the first reference light 2 is directed to the hologram memory cell 3 without direction of the first objective light 1 in reproduction, the first objective light 1 is reproduced according to the hologram theory, to display a first reproduction light 5. In this instance, since the first reproduction light 5 carries all the information of the first objective light 1 recorded in the hologram memory cell 3, the hologram memory cell 3 can be used as the information recording medium.

The hologram memory device is featured in that it can overlap more than two informations in a single cell in storage of the informations. That is, when a second reference light 12 is directed to the hologram memory cell 3 having a particular information recorded therein according to the first objective light 1 and the first reference light 2, at an angle different from the first reference light 2, and a second objective light 11 having an information different from the first objective light 1 is directed thereto at an angle identical to the first objective light 1 in recording, the second reference light 12 and the second objective light 11 makes interference, a second interference pattern 14 is recorded in the hologram memory cell 3 overlapped with the first interference pattern 4 recorded therein. In reproduction thereafter, if the second reference light 12 is only directed to the hologram memory cell 3, a second reproduction light 15 having the same information as the second objective light 11 is displayed. Thus, employing such a principle, different informations can be stored in the same cell in overlap.

The conventional hologram device having the aforementioned operation principle will be explained.

FIG. 2 illustrates a first exemplary conventional hologram memory device, provided with a laser beam source 20, a beam expander 21 for expanding a size of the laser beam emitted from the laser beam source 20, a beam splitter 24 for splitting the beam passed through the beam expander into an objective beam 22 and a reference beam 23, a beam scanner 25 for deflecting and directing an incident beam to a desired direction, a beam cut-off 26 for allowing an incident beam to pass or cutting-off the incident beam, a beam modulator 27 for adjusting a spatial beam distribution of the incident beam, a focusing lens 28 for focusing the incident light onto a point, a hologram memory cell 29 for recording and reproducing optical information, and an optical detector 30 for reading an optical information reproduced from the hologram memory cell and converting into an electrical signal.

The steps of process of the aforementioned hologram memory device for recording the information will be explained.

First, for the first recording, when the beam emitted from the laser beam source 20 is incident to the beam splitter 24 through the beam expander 21, the beam splitter 24 splits the beam into an objective beam 22 and a reference beam. Then, the beam cut-off 26 disposed to allow transmission of the objective beam 22 allows to pass the objective beam 22 to provide the beam to the beam modulator 27. In this instance, the objective beam 22 is modulated of its optical beam distribution at passing the beam modulator 27 into a first information beam 22a having a beam distribution corresponding to a information to be recorded, which is then provided to the hologram memory cell 29. On the other hand, the reference beam 23 is reflected or refracted at a certain angle by the beam scanner 25, to provide a first reference beam 23a. The first reference beam 23a is directed to the focusing lens 28 and refracted to incident to the hologram memory cell 29 at a specific angle q1. Consequently, the first information beam 22a and the first reference beam 23a form an interference pattern in the hologram memory cell 29, to record the interference pattern therein. In the steps of process for conducting a second recording of information in the hologram memory cell 29 having the first recording of information made therein overlapped with the first recording, when the objective beam 22 is provided to the beam modulator 27 through the beam cut-off 26, the objective beam 22 is modulated of its beam distribution into a second information beam 22b having a beam distribution corresponding to the information to be recorded, which is then provided to the hologram memory cell 29. In this instance, the second information beam, having an information different from the first information beam 22a used in the first recording, is adapted to be directed to the hologram memory cell 29 at the same position and angle as the first information beam 22a. On the other hand, the reference beam 23 is directed to the beam scanner 25. The beam scanner 25, adjusted to directed a beam in a different direction for overlapped recording of an information, produces a second reference beam 23b travelling in a direction different from the first reference beam 23a. The second reference beam 23b is focused by the focusing lens 28 onto the hologram memory cell 29. In this instance, though the position of the second reference beam 23b incident to the hologram memory cell 29 is the same with the first reference beam 23a, the incident angle q2 of the second reference beam 23b is different from the incident angle q1 of the first reference beam 23a. Accordingly, the second reference beam 23b and the second information beam 22b make an interference pattern, to record the interference pattern in the hologram memory cell 29. Further, alikely, by changing the incident angle of the reference beam 23 as well as the beam distribution of the objective beam 22 incident to the hologram memory cell 29, another informations can be recorded overlapped one over the other continuously.

The steps of process for reproducing information from the hologram memory device will be explained.

The laser beam emitted from the laser beam source 20 is split into the objective beam 22 and the reference beam 23 during passing through the beam expander 21 and the beam splitter 24. The reference beam 23 is provided to the beam scanner 25, and, as the objective beam 22 will not be used in reproduction, the objective beam 22 is cut-off by putting the beam cut-off 26 into a cut-off state. Then, the beam scanner 25 is adjusted so that the reference beam 23 incident to the beam scanner 25 is reflected or refracted at a specific angle, which is then focused onto the hologram memory cell 29 by the focusing lens 28. If a reproduction of the information recorded at the first time is intended, the reference beam 23 is directed to the hologram memory cell 29 at an angle q1 the same with the first reference beam 23a. The first reference beam 23a produces a first reproduction beam 31a according to the hologram principle, which is then provided to the optical detector 30. In this instance, the first reproduction beam 31a is reproduced from the hologram memory cell 29 carrying the optical information of the first information beam 22a used in the first recording as it was. The optical detector 30 than generates an electrical signal corresponding to the optical information. In case reproduction of the information recorded for the second time is intended, when the beam scanner 25 is adjusted, to generate the second reference beam 23b to incident to the hologram memory cell 29 at an angle q2, a second reproduction beam 31b is produced. In case reproduction of another information is intended, alike the aforementioned fashion, when the beam scanner 25 is adjusted, to generate the second reference beam 23b to incident to the hologram memory cell 29, informations recorded in the hologram memory cell 29 at different angles can be reproduced. However, since the hologram memory device shown in FIG. 2 has only hologram memory cell 29 with a small capacity of information recordal, it has a limitation in recording a great amount of information to a certain extent. Accordingly, a large capacity hologram memory becomes necessary instead of the single memory cell.

FIG. 3 illustrates another exemplary conventional hologram memory device in which a hologram memory array is used in place of the single hologram memory cell.

Referring to FIG. 3, the hologram memory array 32 is fitted to a precision moving device for mechanical moving of the hologram memory array 32 in case of recording or reproduction of information in/from each cell. That is, when it is intended to record information in a cell of the hologram memory array 32, the precision moving device 33 is moved to bring the cell assigned to recorded the information to a designated position, and the information is recorded in the cell in the same fashion explained, before. And, when it is intended to reproduce the information recorded in a certain cell, the precision moving device 33 is moved such that the cell is moved to a position at which the information is recorded therein, and the information in the cell is reproduced in the same fashion explained before.

However, the aforementioned conventional hologram memory devices have the following problems.

First, for directing reference beams each having different direction of travel incident from the beam scanner to the same hologram memory cell, an expensive focusing lens is required.

Second, when the hologram memory array is applied for providing a large capacity of recording, the precision moving device, which is very expensive, should be provided for moving a desired hologram memory cell to a specific position, resulting in a high cost of the entire hologram memory device.

Third, the generally required several seconds of movement of the precision moving device for a precise movement of the hologram memory array is not suitable for a hologram memory device which should satisfy both fast reproduction and large capacity recording of information.

SUMMARY OF THE INVENTION

Accordingly, the present invention is directed to a hologram memory device that substantially obviates one or more of the problems due to limitations and disadvantages of the related art.

An object of the present invention is to provide a hologram memory device which can record and reproduce information at a fast speed.

Another object of the present invention is to provide a hologram memory device at a low cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the hologram memory device is provided with a hologram memory array fixed at a position and having a plurality of memory cells. And, a first HOE (Holographic optical element) array having a plurality of optical elements one to one matched to the plurality of memory cells is provided as well as a second HOE array having a structure identical to the first HOE array. When an objective beam carrying information is incident to an element in the first HOE array in recording, the objective beam is refracted toward a cell in the hologram memory array corresponding to the element. When a reference beam is incident to an element in the second HOE array at an arbitrary angle in recording and reproduction, the reference beam is refracted toward one cell in the hologram memory array corresponding to the element at the same arbitrary angle. The use of the two HOE arrays having an identical structure with the hologram memory array allows the objective beam and the reference beam both for use in recording and reproduction of information incident to a desired cell in the hologram memory array directly without any time delay.

To achieve these and other advantages, there is also provided a hologram memory device, including a beam source for emitting a beam, a beam splitter for splitting the beam into an objective beam and a reference beam, a hologram memory array having a plurality of cells fixed to a position for recording information using the reference beam and the objective beam, a first beam path changing part for adjusting a beam path of the reference beam to direct the reference beam to one desired cell of the plurality of cells and an arbitrary angle for recording and reproduction of the information, a second beam path changing part for adjusting a beam path of the objective beam to direct the objective beam to one desired cell of the plurality of cells for recording the information, a first Holographic Optical Element (HOE) array having a plurality of optical elements one to one matched to the cells in the hologram memory array for directing the reference beam incident to one optical element of the plurality of optical elements from the first beam path changing unit at an arbitrary angle to one cell in the hologram memory array corresponding to the one optical element, and a second HOE array having a plurality of optical elements one to one matched to the cells in the hologram memory array for directing the objective beam incident to one optical element of the plurality of optical elements from the second beam scanner to one cell in the hologram memory array corresponding to the one optical element.

To achieve these and other advantages, there is also provided a hologram memory device, including a hologram memory array having a plurality of cells for recording and reproducing information using a reference beam and an objective beam, and a first Holographic Optical Element (HOE) array positioned to receive the reference beam, wherein the first HOE array comprises a plurality of optical elements one to one matched to the cells in the hologram memory array.

To achieve these and other advantages, there is also provided a hologram memory device, including a beam splitter for splitting a source beam into an objective beam and a reference beam, a hologram memory array having a plurality of cells, a first holographic beam path changing part for adjusting a beam path of the reference beam to direct the reference beam to one desired cell of the plurality of cells, and a second beam path changing part for adjusting a beam path of the objective beam to direct the objective beam to one desired cell of the plurality of cells for recording the information.

To achieve these and other advantages there is also provided a hologram memory device, having a hologram memory array having a plurality of cells, a first beam path changing part for directing a reference beam to the hologram memory array, a second beam path changing part for directing an objective beam to the hologram memory array, and at least one holographic optical element array for receiving at least one of the objective and reference beams from at least one of the first and second beam changing parts and directing the at least one beam to the hologram memory array, wherein the holographic optical array comprises a plurality of optical elements one to one matched to the cells in the hologram memory array.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 7a and 7b illustrate diagrams for explaining a process for recording information in the device shown in FIG. 4.

DETAILED DESCRIPTION OF THE PREFERRED EMBODIMENT

Figure 1:
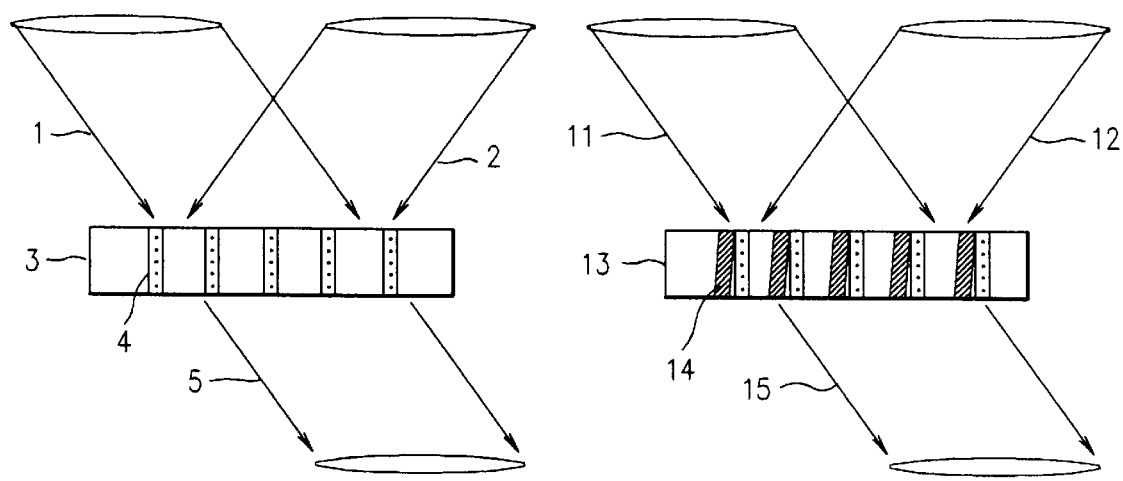
FIGS. 1a and 1b illustrate diagrams for explaining an operation principle of a hologram memory device.
Figure 2:
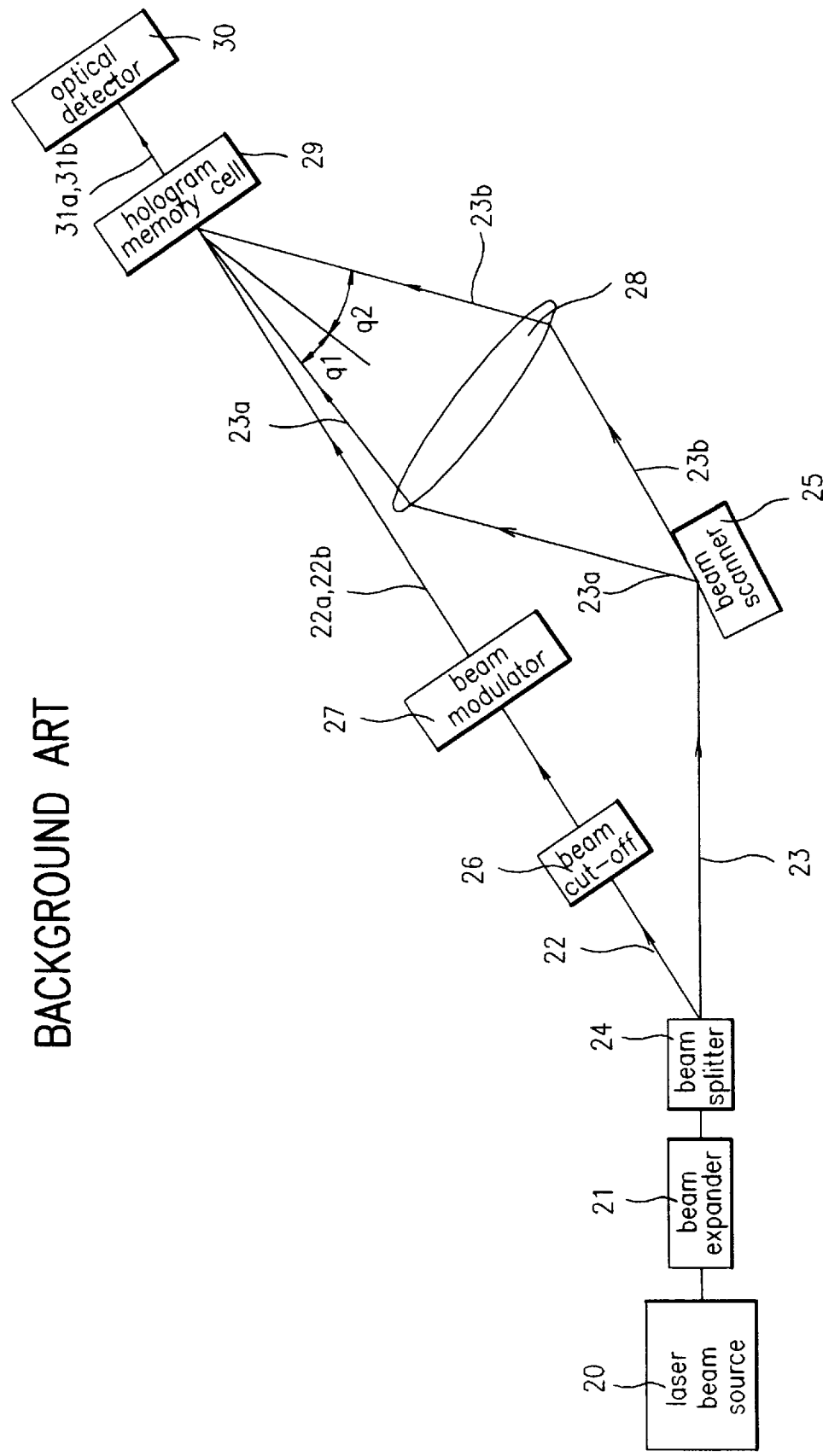
FIG. 2 illustrates a diagram showing a system of a first exemplary conventional hologram memory device.
Figure 3:
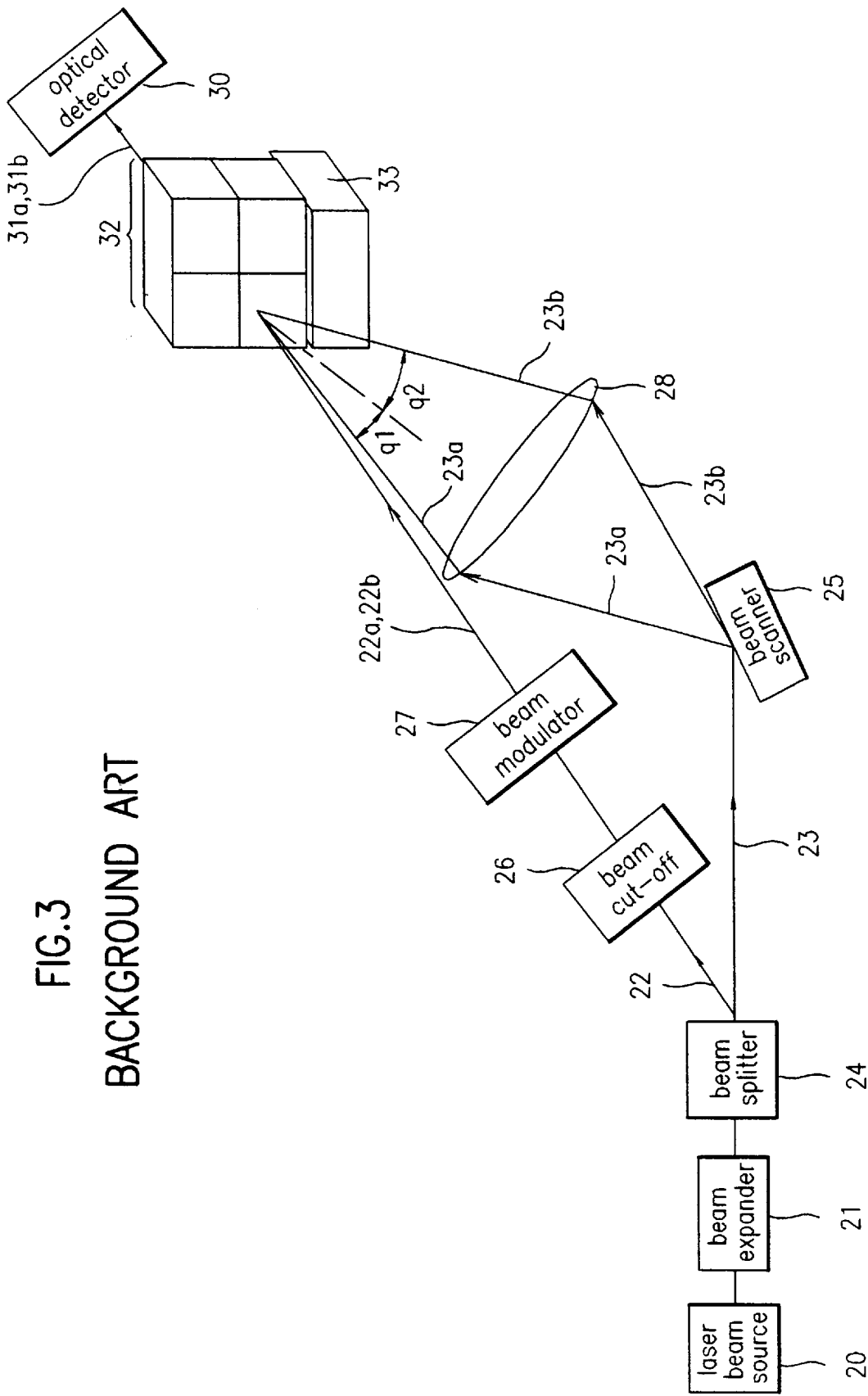
FIG. 3 illustrates a diagram showing a system of another exemplary conventional hologram memory device.
Figure 4:
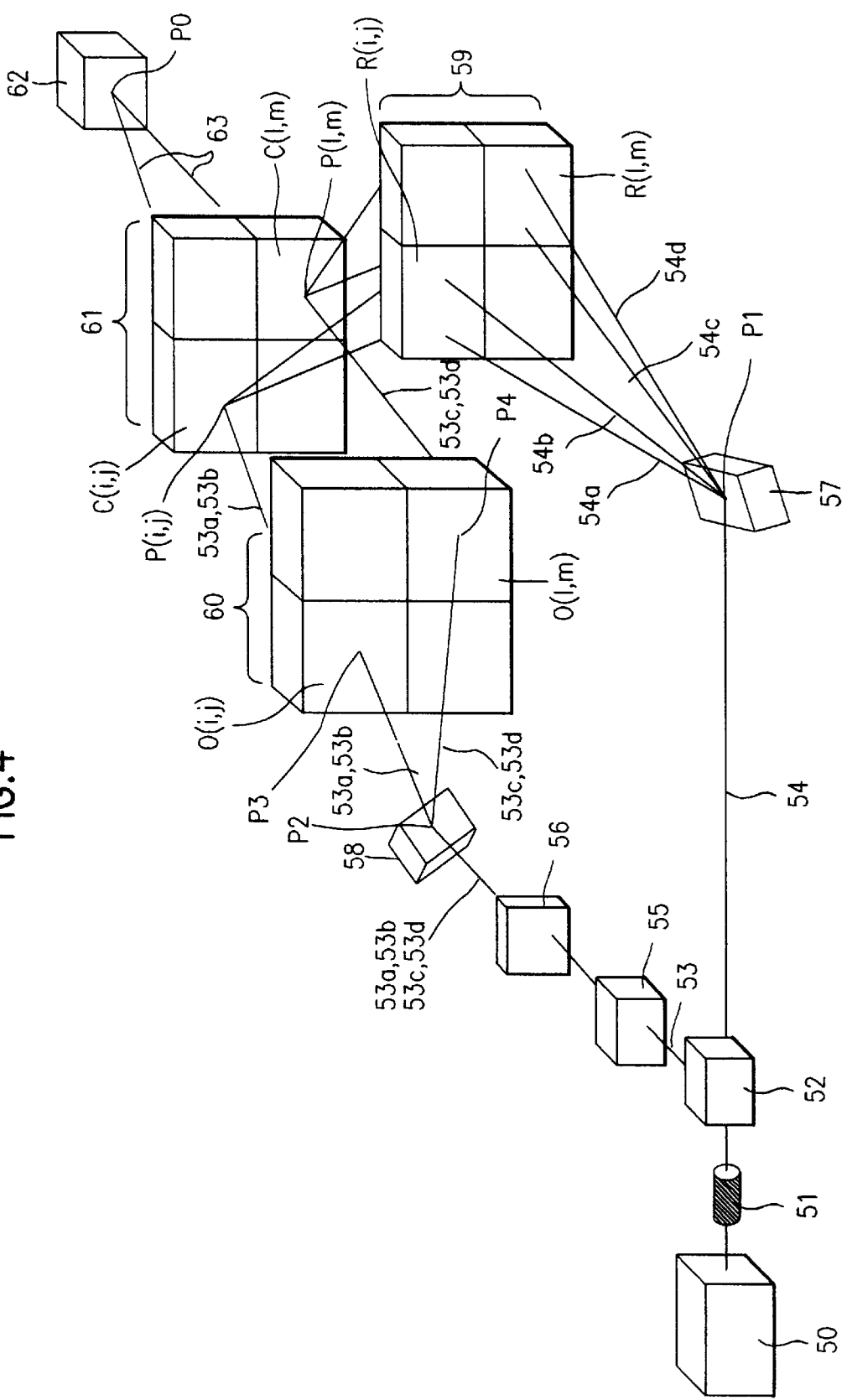
FIG. 4 illustrates a diagram showing a system of a hologram memory device in accordance with the present invention.

Reference will now be made in detail to the preferred embodiments of the present invention, examples of which are illustrated in the accompanying drawings. A hologram memory device in accordance with the present invention will be explained in detail with reference to FIGS. 4–7. FIG. 4 illustrates a diagram showing a system of the hologram memory device in accordance with the present invention.

Referring to FIG. 4, the hologram memory device of the present invention includes a laser beam source 50, a beam expander 51 for expanding a size of the laser beam emitted from the laser beam source 50, a beam splitter 52 for splitting the beam passed through the beam expander 51 into an objective beam 53 and a reference beam 54, a beam cut-off 55 for passing or cutting-off the objective beam 53 incident thereto, a beam modulator 56 for modulating a beam distribution of the objective beam, a first beam scanner 57 for reflecting (or refracting) the reference beam 54 to direct the reference beam 54 to a desired direction, a second beam scanner 58 for reflecting the objective beam 53 to direct the object beam 53 to a desired direction, a first HOE (Holographic Optical Element) array 59 for refracting the reference beam 54 to direct the reference beam 54 to an element thereof, a second HOE (Holographic Optical Element) array 60 for refracting the objective beam 53 to direct the objective beam 53 to an element thereof a hologram memory array 61 for using the reference beam 54 and the objective beam 53 from the first HOE array 59 and the second array HOE 60 in recording and reproduction of information in/from thereof, and an optical detector 62 for reading and converting an optical information into an electrical signal. The hologram memory array 61 is one or two dimensional array of a plurality of hologram memory cells thereto/therefrom information can be recorded or reproduced independently. Each of the first HOE array 59 and the second HOE array 60 has a plurality of holographic optical elements (HOEs) which are arranged to match to cells in the hologram memory cell array 61 in one to one fashion. The second HOE array 60, the hologram memory array 61 and the optical detector 62 are arrange on a common axis, with their centers on the same line. Namely, the hologram array is located between the second HOE array 60 and the optical detector 62.

Figure 5:
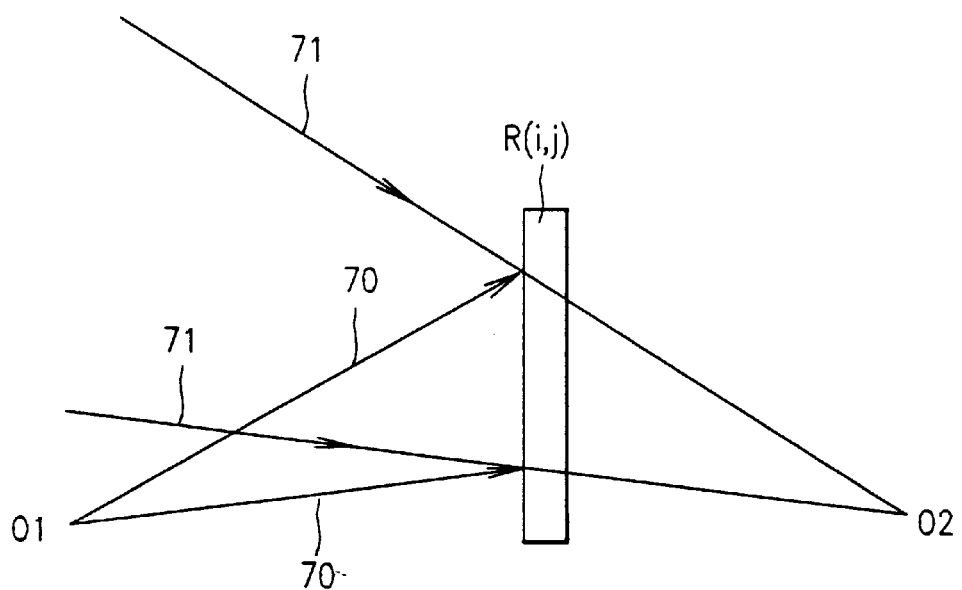
FIG. 5 illustrates a diagram explaining a principle of fabrication of elements in the first holographic optical element array shown in FIG. 4.
Figure 6:
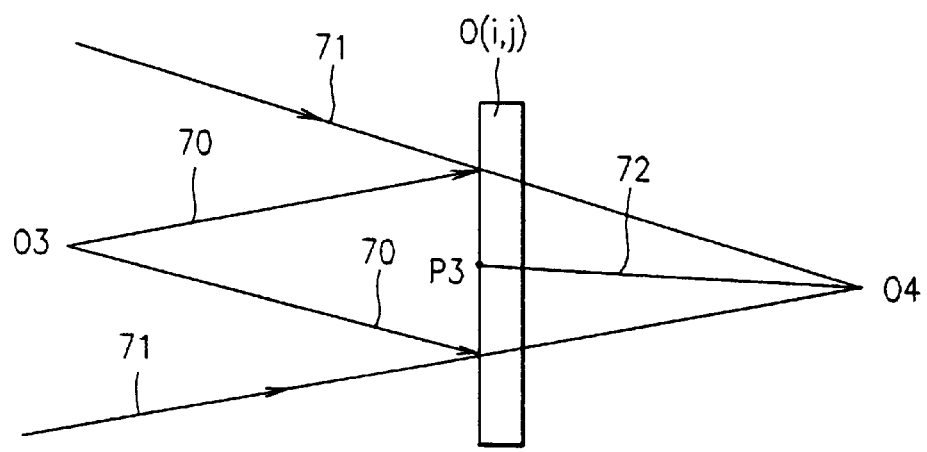
FIG. 6 illustrates a diagram explaining a principle of fabrication of elements in the second holographic optical element array shown in FIG. 4.

The principle of fabrication of each HOE in the first HOE array 59 and the second HOE array 60, which are the most important components in the present invention, will be explained. FIG. 5 illustrates a diagram explaining a principle of fabrication of elements in the first holographic optical element array shown in FIG. 4, and FIG. 6 illustrates a diagram explaining a principle of fabrication of elements in the second holographic optical element array shown in FIG. 4.

It is assumed that (i, j)th HOE in the first HOE array 59 shown in FIG. 4 is R(i, j), (i, j)th cell in the hologram memory array 61 is C(i, j), and a center of the cell C(i, j) is P(i, j). As shown in FIG. 5, the HOE R(i, j) is fabricated by forming and recording an interference pattern on the HOE R(i, j) by directing both a diverging beam 70 started from a diverging point 01 and a converging beam 71 converging at a point 02 to the HOE R(i, j). The point 01 is at a position the same with the incident point P1 of the beam incident to the first beam scanner 57 shown in FIG. 4, and the point 02 is at a position the same with the point P(i, j) of the center of the cell C(i, j) in the hologram memory array 61 shown in FIG. 4. When a beam passing through the point 01 is incident to the HOE R(i, j) thus fabricated, the beam is refracted to reproduce a beam directing toward the point 02 always whichever point on the HOE R(i, j) the beam is directed. And, when an (i, j)th HOE of the HOEs in the second HOE array 60 shown in FIG. 4 is denoted as 0(i, j), as shown in FIG. 6, the HOE 0(i, j) is fabricated by forming and recording an interference pattern on the HOE 0(i, j) by directing both a diverging beam 70 started from a diverging point 03 and a converging beam 71 converging at a point 04 to the HOE 0(i, j). The point 04 is at a position the same with the incident point P2 of the beam incident to the second beam scanner 58 shown in FIG. 4, and the point 04 is at a position the same with the point P(0) of the center of the optical detector 62 shown in FIG. 4. And, the P(i, j), the center point of the hologram memory cell C(i, j) shown in FIG. 4, lies on a line 72 connecting the center point P3 of the HOE 0(i, j) and the focusing point 04. When an objective beam is incident to one of the aforementioned HOEs in the second HOE array 60, the objective beam incident to the HOE is refracted always to travel through a center point of a corresponding hologram memory cell toward the center point P0 of the optical detector 62.

The steps of a process for recording information with the device of the present invention having the two HOE arrays fabricated thus applied thereto will be explained with reference to FIGS. 4 and 7a.

First, for the first recording, upon directing a beam emitted from the laser beam source 50 to the beam splitter 52 through the beam expander 51, the beam splitter 52 splits the beam incident thereto into an objective beam 53 and a reference beam 54. The objective beam 53 is directed to the beam cut-off 55 and the reference beam 54 is directed to the first beam scanner 57, directly. Then, the objective beam 53 passes through the beam cut-off 55 which is in a state to allow transmission of the objective beam 53 incident thereto in recording. The objective beam 53 passes through the beam modulator 56 to have its beam distribution modulated into a first information beam 53a having a beam distribution corresponding to an information to be recorded. The first information beam 53a is directed to, and reflected (or refracted) at the center point P2 of the second beam scanner 58 toward the center point P3 of the HOE 0(i, j) in the second HOE array 60. Then, the first information beam 53a is refracted at the second HOE array 60 toward the center point P(i, j) of the cell C(i, j) in the hologram memory array 61. In this instance, the first information beam 53a incident to the center point P(i, j) is in a direction of the center point P0 of the optical detector 62. In the meantime, the reference beam 54 is reflected (or refracted) at the first beam scanner 57 at a certain angle, to produce a first reference beam 54a. The first reference beam 54a is incident to, and refracted at one HOE R(i, j) in the first HOE array 59 toward the center point P(i, j) in the hologram memory cell C(i, j) at a specific angle q1 as shown in FIG. 7a. Accordingly, by the first information beam 53a and the first reference beam 54a, both incident to the hologram memory cell C(i, j), an interference pattern is recorded in the hologram memory cell C(i, j).

Another interference pattern can be recorded in the hologram memory cell C(i, j) having the first recording thus made therein, overlapped with the first recording. The steps of process for recording information for the second time will be explained. When the objective beam 53 passes through the beam modulator 56 through the beam cut-off 55, the objective beam 53 is modulated of its beam distribution at the beam modulator 56 into a second information beam 53b having a beam distribution corresponding to an information to be recorded for the second time, which is then directed to the second beam scanner 58. In this instance, the second beam scanner 58 is disposed at a state identical to the state of the first recording. Therefore, the second information beam 53b is refracted at the second beam scanner 58 toward the center of the HOE 0(i, j) in the second HOE array 60, and refracted therefrom toward the center P(i, j) of the cell C(i, j) in the hologram memory array 61. That is, the second information beam 53b, having an information different from the first information beam 53a used in first recording, is incident to the same cell C(i, j) and at the same angle, as the first information beam 53a. And, the reference beam 54 is incident to the first beam scanner 57, and the first beam scanner 57 varies a direction of beam travel for overlapped recording of informations. That is, a second reference beam 54b travelling in a direction different from the first reference beam 54a is provided. The second reference beam 54b is refracted at the HOE R(i, j) in the first HOE array 59 toward the center P(i, j) of the cell C(i, j) in the hologram memory array 61. As shown in FIG. 7a, the second reference beam 54b is incident to the cell C(i, j) having the first reference beam 54a incident thereto, the incident angle q2 is different from the incident angle q1 of the first reference beam 54a. Accordingly, the hologram memory cell C(i, j) is recorded of another interference pattern therein by the second reference beam 54b and the second information beam 53b. Further, in the same fashion as above, by changing both the incident angle of the reference beam 54 to the same hologram memory cell C(i, j) and the beam distribution of the information beam 53, other informations may be recorded in the same hologram memory cell C(i, j) overlapped one over the other, continuously.

The steps of process for recording informations in another cell C(l, m) in the hologram memory array 61 will be explained.

Figure 7B:
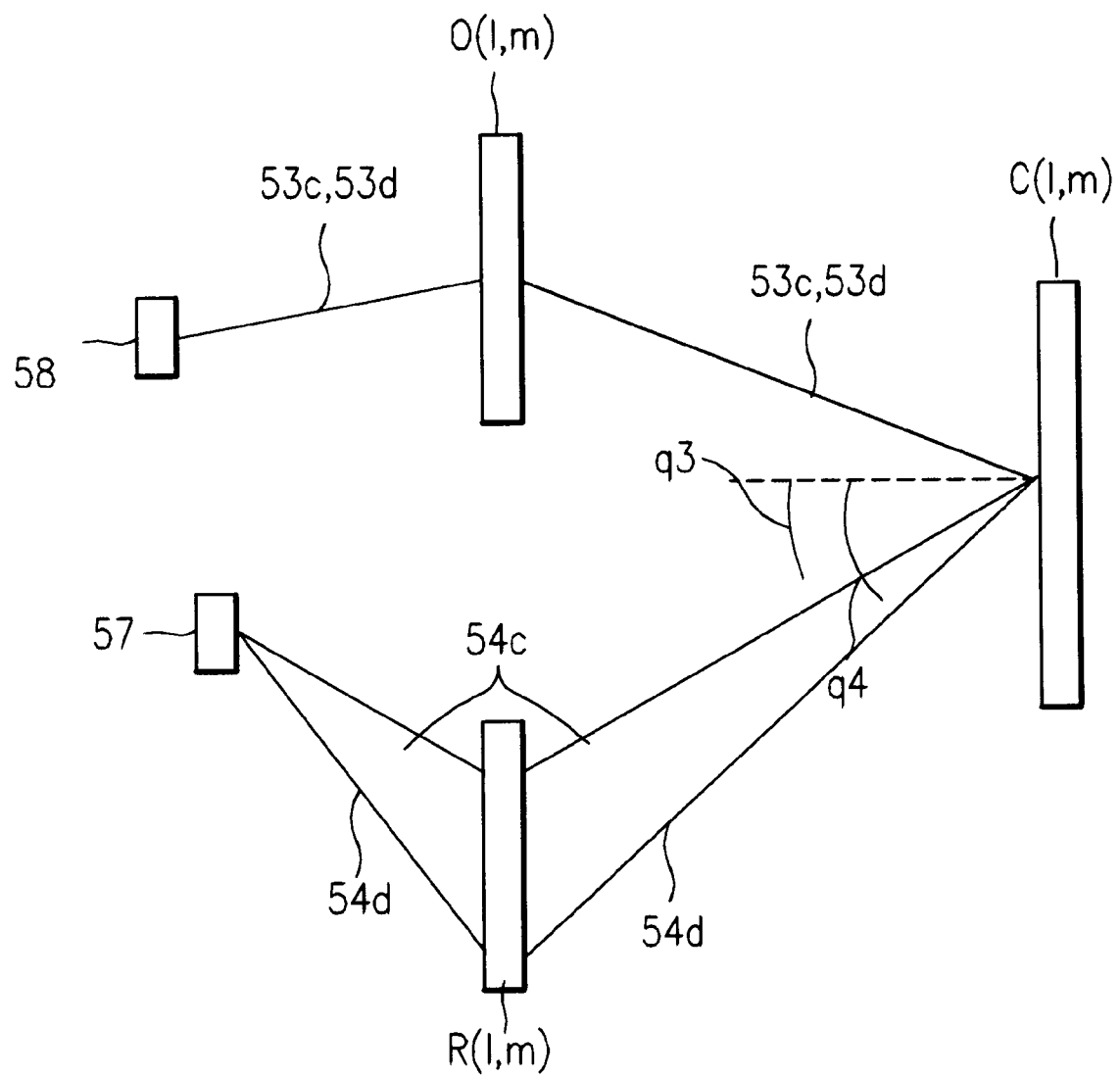

Referring to FIGS. 4 and 7b, a center of another hologram memory cell C(l, m) other than the above cell C(i, j) is denoted as P(l, m). First, the second beam scanner 58 is adjusted to direct a third information beam 53c to a center of an (l, m)th HOE 0(l, m) in the second HOE array 60. The third information beam 53c is refracted at the HOE 0(1, m) toward the center P(l, m) of the hologram memory cell C(l, m). In this instance, the third information beam 53 is refracted in a direction of the center point P0 of the optical detector 62 when the third information beam 53c is incident to the hologram memory cell C(l, m). In the meantime, a third reference beam 54c is refracted at the adjusted first beam scanner 57 toward the (l, m)th HOE R(l, m) in the first HOE array 59. And, the third reference beam 54c is refracted at the HOE R(l, m) toward the center point P(l, m) of the hologram memory cell C(l, m) at an angle q3 as shown in FIG. 7b. Thus, the hologram memory cell C(l, m) is recorded of an interference pattern by the third reference beam 54c and the third information beam 53c. In order to record another information in the same cell C(l, m) overlapped with the aforementioned information, the first beam scanner 57 is at first adjusted, to direct a fourth reference beam 54d, which has a direction of travel different from the third reference beam 54c, to one HOE R(l, m) in the first HOE array 59. The fourth reference beam 54d is refracted at the HOE R(l, m) toward the cell C(l, m) at an angle q4 as shown in FIG. 7b. And, the second beam scanner 58 is adjusted, to direct the fourth information beam 53d modulated in the beam modulator 56 to the P(l, m), the center point of the cell C(l, m), the same with the third information beam 53c by refraction of the HOE 0(1, m), thereby recording an interference pattern in cooperation with the fourth reference beam 54d. Thus, by varying both the incident angle of the reference beam 54 and the beam distribution of the information beam 53, other informations may be recorded in the hologram memory cell C(l, m) overlapped one over the other, continuously.

Next, the steps of process for reproducing the information recorded in the hologram memory cells will be explained.

Referring to FIG. 4, the laser beam emitted from the laser beam source 50 is split into the objective beam 53 and the reference beam 54 as the beam passes through the beam expander 51 and the beam splitter 52. While the objective beam 53 is cut-off at the beam cut-off 55 because the objective beam 53 will not be used in reproduction, the reference beam 54 is provided to the first beam scanner 57. The first beam scanner 57 is adjusted, to refract the reference beam 54 toward a desired HOE in the first HOE array 59. The HOE refracts the reference beam 54 to direct the reference beam 54 toward a desired hologram memory cell. If reproduction of the information recorded in the cell C(i, j) in the hologram memory array 61 for the first time is desired, the first beam scanner 57 is adjusted, to direct the reference beam 54 to the hologram memory cell C(i, j) at the same angle q1 with the first reference beam 54a used in the first recording. In the meantime, if reproduction of the information recorded in the cell C(i, j) in the hologram memory array 61 for the second time is desired, the first beam scanner 57 is adjusted, to direct the reference beam 54 to the hologram memory cell C(i, j) at the same angle q2 with the second reference beam 54b used in the second time recording. Thus, the reference beam 54 directed to a hologram memory cell produces a reproduction beam 63 according to a hologram principle, the reproduction beam 63 is provided to the optical detector 62, and the optical detector generates an electrical signal corresponding to the reproduced optical information. In this instance, the reproduction beam 63 is reproduced as it was, carrying the optical information of the information beam used in recording. If reproduction of another information is desired, the another information may be reproduced in the same fashion identical to above. That is, if the first beam scanner 57 is varied, to direct the reference beams incident thereto to the same hologram memory cell, informations different from one another recorded in the hologram memory cell can be reproduced.

The hologram memory device of the present invention has the following advantages.

First, because the HOE arrays are applied in place of the expensive focusing lens, the production cost can be lowered.

Second, since an objective beam and a reference beam can be directed to a desired cell in a hologram memory array directly, without use of the expensive precision moving device for moving the hologram memory array to a designated position, the entire production cost can be reduced.

Third, the shortened recording and reproduction time coming from the non-use of the precision moving device and the focusing lens is favorable to a fast hologram memory device.

It will be apparent to those skilled in the art that various modifications and variations can be made in the hologram memory device of the present invention without departing from the spirit or scope of the invention. Thus, it is intended that the present invention cover the modifications and variations of this invention provided they come within the scope of the appended claims and their equivalents.

What is claimed is:

1. A hologram memory device, comprising:
    a hologram memory array having a plurality of cells each for recording information using a reference beam and an objective beam;
    a first HOE (Holographic Optical Element) array having a plurality of elements one to one matched to the plurality of cells for directing the reference beam incident to one element of the elements at an arbitrary angle to one of the cells in the hologram memory array corresponding to the one element in recording and reproduction; and,
    a second HOE array having a plurality of elements one to one matched to the plurality of cells for directing the objective beam incident to one element of the elements to one cell in the hologram memory array corresponding to the one element in recording.

2. A device as claimed in claim 1, wherein the hologram memory array is fixed at a position during recording and reproduction of the information.

3. A device as claimed in claim 1, wherein the reference beam and the objective beam are directed to the same one cell in the hologram memory array through the first HOE array and the second HOE array, respectively.

4. A hologram memory device, comprising:
    a beam source for emitting a beam;
    a beam splitter for splitting the beam into an objective beam and a reference beam;
    a hologram memory array having a plurality of cells fixed to a position for recording information using the reference beam and the objective beam;
    a first beam path changing part for adjusting a beam path of the reference beam to direct the reference beam to one desired cell of the plurality of cells at an arbitrary angle for recording and reproduction of the information;
    a second beam path changing part for adjusting a beam path of the objective beam to direct the objective beam to one desired cell of the plurality of cells for recording the information;
    a first HOE (Holographic Optical Element) array having a plurality of optical elements one to one matched to the cells in said hologram memory array for directing the reference beam incident to one optical element of the plurality of optical elements from said first beam path changing part at an arbitrary angle to one cell in said hologram memory array corresponding to the one optical element; and
    a second HOE array having a plurality of optical elements one to one matched to the cells in said hologram memory array for directing the objective beam incident to one optical element of the plurality of optical elements from said second beam path changing part to one cell in said hologram memory array corresponding to the one optical element.

5. A device as claimed in claim 4, wherein the reference beam and the objective beam are directed to the same one cell in the hologram memory array through the first beam path changing part and the second beam path changing part, respectively.

6. The device of claim 4, wherein said first beam path changing part comprises a first beam scanner for reflecting the reference beam from said beam splitter to a desired direction.

7. The device of claim 4, wherein said second beam path changing part comprises a second beam scanner for reflecting the objective beam from said beam splitter to a desired direction.

8. A device as claimed in claim 7, firther including a beam cut-off for passing the objective beam from the beam splitter to the second beam scanner in recording and cutting off the objective beam in reproduction.

9. A device as claimed in claim 4, wherein the hologram memory array is fixed to a position during recording and reproduction of the hologram information.

10. A hologram memory device, comprising:
a beam source for emitting a beam;
a beam splitter for splitting the beam into an objective beam and a reference beam;
a beam cut-off for passing and cutting-off the objective beam from the beam splitter in recording and reproduction, respectively;
a beam modulator for modulating a beam distribution of the objective beam passed through the beam cut-off in recording so that the objective beam carries a certain information;
a first beam scanner for reflecting the reference beam from the beam splitter to a desired direction and at an arbitrary angle in recording and reproduction;
a second beam scanner for reflecting the objective beam from the beam modulator to a desired direction in recording;
a hologram memory array having a plurality of cells for recording information in one of the cells when the reference beam and the objective beam are incident thereto together and reproducing the information recorded therein previously when only the reference beam is incident thereto;
a first HOE (Holographic Optical Element) array having a plurality of optical elements one to one matched to the cells for directing the reference beam, reflected at the first beam scanner and incident to one optical element at an arbitrary angle, to one cell in the hologram memory array corresponding to the one optical element in recording and reproduction;
a second HOE array having a plurality of optical elements one to one matched to the cells for directing the objective beam, reflected at the second beam scanner and incident to one optical element, to one cell in the hologram memory array corresponding to the one optical element in recording; and,
an optical detector for converting an optical information reproduced from the hologram memory array into an electrical signal.

11. A device as claimed in claim 10, wherein the beam source is a laser beam source.

12. A device as claimed in claim 10, wherein the second beam scanner refracts the objective beam for directing the objective beam received from the beam modulator to a center of a desired element in the second HOE array.

13. A device as claimed in claim 10, wherein the first beam scanner refracts the reference beam for directing the reference beam received from the beam splitter to different elements in the first HOE array at angles different from one another, for overlapped recording and overlapped reproduction of informations.

14. A device as claimed in claim 10, wherein the second HOE array, the hologram memory array and the optical detector are arranged in a same direction for placing their centers on a same line.

15. A device as claimed in claim 10, wherein the reference beam and the objective beam passed through the first HOE array and the second HOE array respectively are incident to a same one cell in the hologram memory array, together.

16. A device as claimed in claim 10, wherein the objective beam incident to the second HOE array is directed to a cell in the hologram memory array such that the objective beam travels to a center of the optical detector.

17. A device as claimed in claim 10, wherein the reference beams incident to respective elements in the first HOE array and the objective beams incident to respective elements in the second HOE array are incident to centers of respective cells in the hologram memory array corresponding to the elements.

18. A device as claimed in claim 10, wherein each of the elements in the first HOE array is formed by directing both a diverging beam from a diverging point which is an incident point of a beam to the first beam scanner and a converging beam converging to a converging point which is a center point of a cell in the hologram memory array to one of the elements in question.

19. A device as claimed in claim 10, wherein each of the elements in the second HOE array is formed by directing both a diverging beam from a diverging point which is an incident point of a beam to the second beam scanner and a converging beam converging to a converging point which is a center point of the optical detector to one of the elements in question.

20. A device as claimed in claim 10, further comprising a beam expander disposed between the beam source and the beam splitter for expanding a size of the beam.

21. A hologram memory device, comprising:
a hologram memory array having a plurality of cells for recording and reproducing information using a reference beam and an objective beam; and
a first Holographic Optical Element (HOE) array positioned to receive the reference beam;
wherein said first HOE array comprises a plurality of optical elements one to one matched to the cells in the hologram memory array.

22. The hologram memory device of claim 21, further comprising a second HOE array positioned to receive the objective beam.

23. The hologram memory device of claim 22, wherein said second HOE array comprises a plurality of optical elements one to one matched to the cells in the hologram memory array.

24. The hologram memory device of claim 23, further comprising:
a first beam scanner positioned to direct the reference beam to a selectable one of said optical elements of said first HOE arrays; and
a second beam scanner positioned to direct the objective beam to a selectable one of said optical elements of said second HOE array.

25. The hologram memory device of claim 24, further comprising a beam splitter for splitting a source beam into said objective beam and said reference beam.

26. The hologram memory device of claim 24, further comprising an optical detector for converting optical information reproduced from the hologram memory array into an electrical signal.

27. The hologram memory device of claim 26, wherein said second HOE array, said hologram memory array, and said optical detector are arranged along a common axis such that their centers are aligned.

28. The hologram memory device of claim 21, further comprising a beam scanner positioned to receive the reference beam and direct it to a selectable one of said optical elements of said first HOE array.

29. A hologram memory device, comprising:
a beam splitter for splitting a source beam into an objective beam and a reference beam;
a hologram memory array having a plurality of cells;

a first holographic beam path changing part that adjusts a beam path of the reference beam to direct the reference beam to one desired cell of the plurality of cells; and a second beam path changing part that adjusts a beam path of the objective beam to direct the objective beam to one desired cell of the plurality of cells.

30. The hologram memory device of claim 29, wherein said first holographic beam path changing part comprises:

a first Holographic Optical Element (HOE) array; and a first beam scanner for receiving the reference beam from said beam splitter and directing the reference beam to said first HOE array.

31. The hologram memory device of claim 30, wherein said first HOE array comprises a plurality of optical elements one to one matched to the cells in the hologram memory array.

32. The hologram memory device of claim 29, wherein said second beam path changing part comprises a second holographic beam path changing part.

33. The hologram memory device of claim 32, wherein said second holographic beam path changing part comprises:

a second Holographic Optical Element (HOE) array; and a second beam scanner for receiving the objective beam from the beam splitter and directing the objective beam to said second HOE array.

34. The hologram memory device of claim 33, wherein said second HOE array comprises a plurality of optical elements one to one matched to the cells in the hologram memory array.

35. A hologram memory device, comprising:

a hologram memory array having a plurality of cells;

a first beam path changing means for directing a reference beam to said hologram memory array;

a second beam path changing means for directing an objective beam to said hologram memory array; and at least one holographic optical element (HOE) array for receiving at least one of said objective beam and said reference beam from at least one of said first and second beam path changing parts and directing said at least one beam to said hologram memory array;

wherein said HOE array comprises a plurality of optical elements one to one matched to the cells in the hologram memory array.

36. The hologram memory device of claim 25, further comprising:

a beam modulator that modulates a distribution of said objective beam; and a beam cut-off that passes or cuts-off said objective beam.

37. The hologram memory device of claim 36, further comprising:

a laser beam source that generates a beam; and a beam expander that receives and expands the beam.

* * * * *